US010025177B2

(12) United States Patent
Lee et al.

(10) Patent No.: US 10,025,177 B2
(45) Date of Patent: Jul. 17, 2018

(54) EFFICIENT WAY TO CREATING PROCESS WINDOW ENHANCED PHOTOMASK LAYOUT

(71) Applicant: Samsung Electronics Co., Ltd., Suwon-si, Gyeonggi-do (KR)

(72) Inventors: Mindy Lee, Sunnyvale, CA (US); Jung H. Woo, Beaverton, OR (US)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 15/230,356

(22) Filed: Aug. 5, 2016

(65) Prior Publication Data
US 2017/0269470 A1 Sep. 21, 2017

Related U.S. Application Data

(60) Provisional application No. 62/309,343, filed on Mar. 16, 2016.

(51) Int. Cl.
*G06F 17/50* (2006.01)
*G03F 1/70* (2012.01)

(52) U.S. Cl.
CPC ............ *G03F 1/70* (2013.01); *G06F 17/5072* (2013.01); *G06F 17/5081* (2013.01)

(58) Field of Classification Search
USPC ......................................................... 716/52
See application file for complete search history.

(56) References Cited

U.S. PATENT DOCUMENTS

| 7,788,628 B1* | 8/2010 | Wei ..................... G03F 7/70425 716/51 |
| 7,842,926 B2 | 11/2010 | Olsson et al. |
| 7,933,471 B2 | 4/2011 | Li et al. |
| 8,146,026 B2 | 3/2012 | Agarwal et al. |
| 8,336,006 B2 | 12/2012 | Kodera et al. |
| 8,533,634 B2 | 9/2013 | Itoh |
| 8,542,340 B2 | 9/2013 | Ye et al. |
| 2010/0141925 A1 | 6/2010 | Cao et al. |
| 2010/0251202 A1* | 9/2010 | Pierrat ..................... G03F 1/36 716/50 |
| 2013/0131857 A1* | 5/2013 | Fan ......................... G06F 17/50 700/121 |

* cited by examiner

*Primary Examiner* — Bryce Aisaka
(74) *Attorney, Agent, or Firm* — Lewis Roca Rothgerber Christie LLP (57) ABSTRACT

A method of making a photomask includes constructing a transmission cross coefficient (TCC) matrix representing an illumination source for supplying light to transmit through the photomask and a pupil for focusing the transmitted light onto a target substrate to produce a set of main features, generating kernels through decomposition of the TCC matrix, selecting ones of the kernels having odd symmetry, generating a field map kernel as a sum of self-convolutions of the odd symmetry kernels, generating a first field map by convolving an area of the photomask corresponding to the set of main features with the field map kernel, and making the photomask corresponding to the first field map. The method may include assigning first sub-resolution assist features (SRAFs) to those portions of the photomask area having corresponding said first field map values exceeding a nonnegative threshold, and making the photomask corresponding to the main features and first SRAFs.

20 Claims, 8 Drawing Sheets
(8 of 8 Drawing Sheet(s) Filed in Color)

Patterning Without mask modification

FIG. 1B

Patterning With mask modification

EFFICIENT WAY TO CREATING PROCESS WINDOW ENHANCED PHOTOMASK LAYOUT

CROSS-REFERENCE TO RELATED APPLICATION

This application claims priority to and the benefit of Provisional Application No. 62/309,343, filed on Mar. 16, 2016, the entire content of which is herein incorporated by reference.

BACKGROUND

1. Field

Aspects of embodiments of the present invention are directed toward efficient ways of creating process window enhanced photomask layouts.

2. Description of Related Art

Photolithography is used, for example, to fabricate semiconductor devices, such as microprocessors, with a high density of circuits. When the size of a circuit is reduced by half in both length and width, the corresponding number of circuits that can fit in the same area grows by a factor of four, thus allowing a greater number of devices or more complex devices to fit in the same amount of space. Accordingly, improving the photolithography process to produce smaller circuits is an ongoing effort.

Photolithography makes use of photomasks to pattern two-dimensional features on, for example, a wafer (such as a silicon wafer) used to fabricate semiconductor devices. Photolithography uses light to expose the features through the photomask and onto a light sensitive material (such as photoresist). Present photolithography uses ultraviolet light, such as 193 nanometer (nm) wavelength, to produce feature sizes down to around 50 nm. However, when pushing the limits (such as diffraction limits) of the optical wavelength, the resulting features may no longer resemble the pattern in the photomask.

SUMMARY

Aspects of embodiments of the present invention are directed toward methods of creating sub resolution assist features (SRAFs) for photomasks used in fabricating entire semiconductor devices (e.g., full chip) to compensate for diffraction and other errors introduced in the photolithography process at sub resolution levels (e.g., feature sizes smaller than the exposing light wavelength). Still further aspects are directed toward analytical methods of improving accuracy and computational efficiency of generating SRAF maps compared to comparable techniques. Yet still further aspects are directed toward creating an optimal mask (both main feature and assist feature) for patterning a given feature with fidelity.

According to an embodiment of the present invention, a method of making a photomask is provided. The method includes constructing a transmission cross coefficient (TCC) matrix representing an illumination source for supplying light to transmit through the photomask and a pupil for focusing the transmitted light onto a target substrate to produce a set of main features, generating kernels through decomposition of the TCC matrix, selecting ones of the kernels having odd symmetry, generating a field map kernel as a sum of self-convolutions of the odd symmetry kernels, generating a first field map by convolving an area of the photomask corresponding to the set of main features with the field map kernel, and making the photomask corresponding to the first field map.

The method may further include assigning first sub-resolution assist features (SRAFs) to those portions of the photomask area having corresponding said first field map values exceeding a nonnegative threshold. The making of the photomask may include making the photomask corresponding to the set of main features and the first SRAFs.

The method may further include performing SRAF rule processing on the first SRAFs to produce second SRAFs. The making of the photomask may include making the photomask corresponding to the set of main features and the second SRAFs.

The SRAF rule processing may include applying one or more of mask rule check (MRC), SRAF printability check, and polygon extraction to the first SRAFs to produce the second SRAFs.

The method may further include generating a second field map by convolving an area of the photomask corresponding to the set of main features and the second SRAFs with the field map kernel. The making of the photomask may include making the photomask corresponding to the second field map.

The method may further include assigning third SRAFs to those portions of the photomask area having corresponding said second field map values exceeding the nonnegative threshold, and performing the SRAF rule processing on the third SRAFs to produce fourth SRAFs. The making of the photomask may include making the photomask corresponding to the set of main features and the fourth SRAFs.

The method may further include generating a third field map by convolving an area of the photomask corresponding to the set of main features and the fourth SRAFs with the field map kernel, assigning fifth SRAFs to those portions of the photomask area having corresponding said third field map values exceeding the nonnegative threshold, and performing the SRAF rule processing on the fifth SRAFs to produce sixth SRAFs. The making of the photomask may include making the photomask corresponding to the set of main features and the sixth SRAFs. The making of the photomask may include making a projection photomask for use in very large scale integration (VLSI) lithography.

According to another embodiment of the present invention, a system for making a photomask is provided. The system includes a processor and a non-transitory physical medium. The medium has instructions stored thereon that, when executed by the processor, causes the processor to construct a transmission cross coefficient (TCC) matrix representing an illumination source for supplying light to transmit through the photomask and a pupil for focusing the transmitted light onto a target substrate to produce a set of main features, generate kernels through decomposition of the TCC matrix, select ones of the kernels having odd symmetry, generate a field map kernel as a sum of self-convolutions of the odd symmetry kernels, and generate a first field map by convolving an area of the photomask corresponding to the set of main features with the field map kernel. The system further includes a photomask fabricator configured to make the photomask corresponding to the first field map.

The instructions, when executed by the processor, may further cause the processor to assign first sub-resolution assist features (SRAFs) to those portions of the photomask area having corresponding said first field map values exceeding a nonnegative threshold. The photomask fabricator may be further configured to make the photomask corresponding to the set of main features and the first SRAFs.

The instructions, when executed by the processor, may further cause the processor to perform SRAF rule processing on the first SRAFs to produce second SRAFs. The photomask fabricator may be further configured to make the photomask corresponding to the set of main features and the second SRAFs.

The SRAF rule processing may include applying one or more of mask rule check (MRC), SRAF printability check, and polygon extraction to the first SRAFs to produce the second SRAFs.

The instructions, when executed by the processor, may further cause the processor to generate a second field map by convolving an area of the photomask corresponding to the set of main features and the second SRAFs with the field map kernel. The photomask fabricator may be further configured to make the photomask corresponding to the second field map.

The instructions, when executed by the processor, may further cause the processor to assign third SRAFs to those portions of the photomask area having corresponding said second field map values exceeding the nonnegative threshold, and perform the SRAF rule processing on the third SRAFs to produce fourth SRAFs. The photomask fabricator may be further configured to make the photomask corresponding to the set of main features and the fourth SRAFs.

The instructions, when executed by the processor, may further cause the processor to generate a third field map by convolving an area of the photomask corresponding to the set of main features and the fourth SRAFs with the field map kernel, assign fifth SRAFs to those portions of the photomask area having corresponding said third field map values exceeding the nonnegative threshold, and perform the SRAF rule processing on the fifth SRAFs to produce sixth SRAFs. The photomask fabricator may be further configured to make the photomask corresponding to the set of main features and the sixth SRAFs.

According to yet another embodiment of the present invention, a method of making an integrated circuit (IC) chip on a silicon wafer is provided. The method includes making one or more photomasks. The making of each of the one or more photomasks includes constructing a transmission cross coefficient (TCC) matrix representing an illumination source for supplying light to transmit through the photomask and a pupil for focusing the transmitted light onto a target substrate to produce a set of main features, generating kernels through decomposition of the TCC matrix, selecting ones of the kernels having odd symmetry, generating a field map kernel as a sum of self-convolutions of the odd symmetry kernels, generating a first field map by convolving an area of the photomask corresponding to the set of main features with the field map kernel, and making the photomask corresponding to the first field map, The method further includes using the one or more photomasks to fabricate the IC chip on the silicon wafer using photolithography.

The making of each of the one or more photomasks may further include assigning first sub-resolution assist features (SRAFs) to those portions of the photomask area having corresponding said first field map values exceeding a nonnegative threshold. The making of the photomask may include making the photomask corresponding to the set of main features and the first SRAFs.

The making of each of the one or more photomasks may further include performing SRAF rule processing on the first SRAFs to produce second SRAFs. The making of the photomask may include making the photomask corresponding to the set of main features and the second SRAFs.

The SRAF rule processing may include applying one or more of mask rule check (MRC), SRAF printability check, and polygon extraction to the first SRAFs to produce the second SRAFs.

The making of each of the one or more photomasks may further include generating a second field map by convolving an area of the photomask corresponding to the set of main features and the second SRAFs with the field map kernel, assigning third SRAFs to those portions of the photomask area having corresponding said second field map values exceeding the nonnegative threshold, and performing the SRAF rule processing on the third SRAFs to produce fourth SRAFs. The making of the photomask may include making the photomask corresponding to the set of main features and the fourth SRAFs.

The making of each of the one or more photomasks may further include generating a third field map by convolving an area of the photomask corresponding to the set of main features and the fourth SRAFs with the field map kernel, assigning fifth SRAFs to those portions of the photomask area having corresponding said third field map values exceeding the nonnegative threshold, and performing the SRAF rule processing on the fifth SRAFs to produce sixth SRAFs. The making of the photomask may include making the photomask corresponding to the set of main features and the sixth SRAFs.

According to the above and other embodiments, new methods and algorithms are provided to generate SRAF maps for photomasks used in manufacturing semiconductor devices. In these new approaches, new cost functions and new kernels are used in algorithm development that have a sound physical basis, versus comparable techniques that overly simplify the underlying physics and require calibration to produce sufficiently accurate results. Further, these techniques are both accurate and computationally efficient. In addition, these techniques may be applied to a full chip device (whose circuit count may number in the billions) and are more computationally practical than comparable inverse lithography technology (ILT) techniques.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, together with the specification, illustrate example embodiments of the present invention. These drawings, together with the description, serve to better explain aspects and principles of the present invention.

FIG. 1, which includes

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

The electronic or electric devices and/or any other relevant devices or components according to embodiments of the present invention described herein may be implemented utilizing any suitable hardware, firmware (e.g., an application-specific integrated circuit (ASIC)), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

In addition, the various components of these devices may be a process or thread, running on one or more computer processors (such as microprocessors), in one or more computing devices, executing computer program instructions and interacting with other system components for performing the various functionalities described herein. The computer program instructions may be stored in a memory that may be implemented in a computing device using a standard memory device such as random access memory (RAM). The computer program instructions may also be stored in other, non-transitory, computer readable media such as, for example, a CD-ROM, flash drive, or the like.

Further, a person of skill in the art should recognize that the functionality of various computing devices may be combined or integrated into a single computing device, or the functionality of a particular computing device may be distributed across one or more other computing devices without departing from the spirit and scope of the present invention.

Figure 1A:
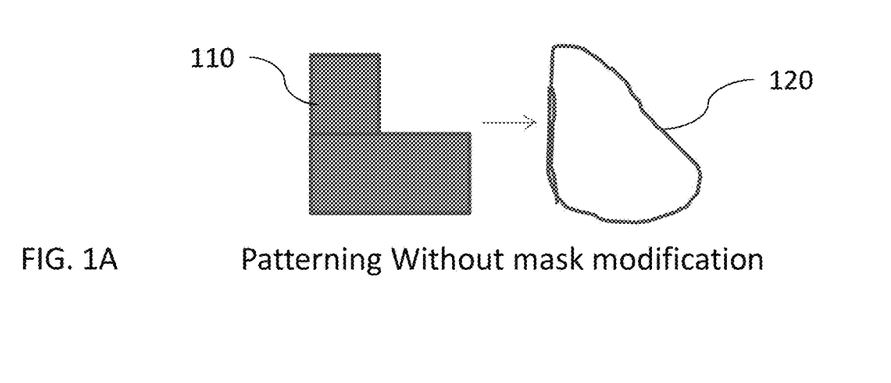
FIGS. 1A-1B, is a set of schematic diagrams illustrating effects of sub resolution feature creation using photolithography, using an unmodified photomask and using a modified photomask according to an embodiment of the present invention.
Figure 1B:
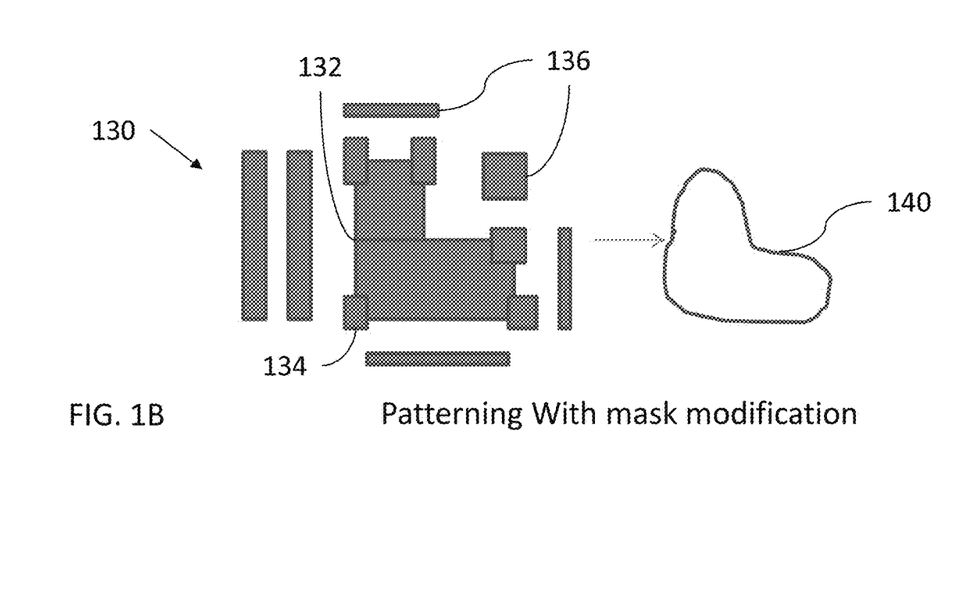

FIG. 1, which includes FIGS. 1A-1B, is a set of schematic diagrams illustrating effects of sub resolution feature creation using photolithography, using an unmodified photomask and using a modified photomask according to an embodiment of the present invention. For ease of description, unless otherwise described, photomasks will be assumed to be made up of possibly contiguous or overlapping rectangles (representing openings through which light passes through) oriented north-south and east-west, though the present invention is not limited thereto.

When applying photolithography to creating features at sub resolution levels (e.g., features or pitches between features that are smaller than the wavelength of light used to expose the light-sensitive materials through the photomask), the actual features may no longer resemble the intended features sufficiently for the resulting circuit to function as intended. FIG. 1A illustrates an unmodified photomask opening 110 (intended to produce a feature of the same shape) for a sub resolution feature that, when fabricated, results in the shape 120. The intended shape 110 and final shape 120 differ due to effects like diffraction when the feature is smaller than the light wavelength (e.g., 193 nm).

However, as illustrated in FIG. 1B, according to an embodiment of the present invention, sub resolution assist feature (SRAF) generation (separated from the main feature) and optical proximity correction (OPC) overlapping the main feature may be used to produce a different mask pattern 130 whose resulting feature shape 140 at sub resolution levels is significantly closer to the intended shape 110 than the feature 120 produced with the intended shape 110. One or more embodiments of the present invention are directed to techniques of efficiently generating photomask patterns such as pattern 130 to produce intended shapes such as shape 110 using sub resolution photolithography. Further embodiments are directed to methods and algorithms of creating SRAFs for photomask manufacturing.

In FIG. 1B, mask pattern 130 is made up of 13 rectangles (as opposed to the two rectangles in mask pattern 110 of FIG. 1A), including two contiguous rectangles 132 making up the intended shape (main rectangles or main feature), five overlapping rectangles 134 (overlapping the main rectangles 132, sometimes referred to as optical proximity corrections, and sometimes included in the main feature rectangles), and six disconnected rectangles 136 separated from the main rectangles 132 and overlapping rectangles 134. The disconnected rectangles 136 are also known as SRAFs. The SRAFs 136 are placed near main features 132 (including the overlapping rectangles 134) to help better exposure of the main features, but the SRAFs 136 themselves are narrow or small to prevent or reduce inadvertent exposing of non-feature area during the photolithographic process.

According to one or more embodiments, new kernels (basis functions) different from those in original form are used for intensity or coherence map calculations, which may be used to create the SRAFs. The procedure of creating these kernels are well defined, unique, and may be optimal for fast computation even at various wafer processing window conditions such as varying dose and focus conditions.

For ease of description, it will be assumed that the mask is being solved (or designed) for, the intensity (e.g., light intensity on a corresponding portion of a target substrate or integrated circuit (IC) chip) of which is given as a function of the mask, pupil, and source illumination. This is consistent with most situations, where the source and pupil are assumed to be constant and the problem reduces to solving for the mask. When the intensity for a particular portion exceeds a process-defined threshold, corresponding photoresist on the target substrate is chemically altered by the light, allowing the altered photoresist to be removed and exposing a corresponding pattern that may be used to form a layer in the IC chip.

One goal may be to get the intended features (main feature area) to be exposed properly to the light and all other areas to stay below the exposure levels that would cause those areas to print (e.g., alter the photoresist sufficiently to cause those areas to become part of the final layer being fabricated with the photomask). This may be challenging to do for an entire chip because the individual circuits on the chip cannot be considered in isolation as the SRAFs and OPC done for one feature may affect nearby features as well.

Figure 2:
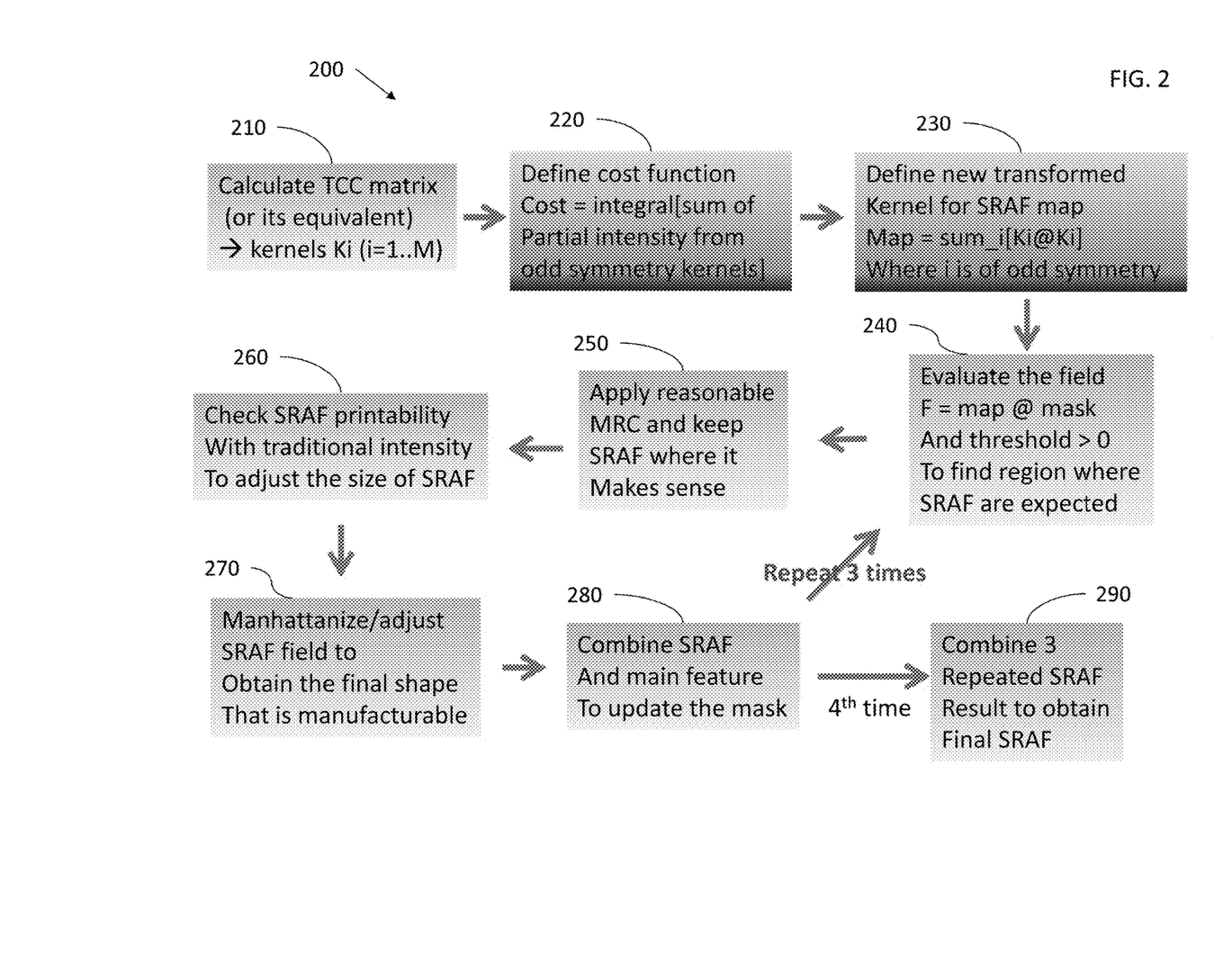
FIG. 2 is an example method of determining sub-resolution assist feature (SRAF) placement of a mask according to an embodiment of the present invention.

FIG. 2 is an example method 200 of determining SRAF placement of a mask according to an embodiment of the present invention.

This and other methods disclosed herein may be implemented, for example, as a series of computer instructions to be executed by a processor (or other computing device), such as a microprocessor, or two or more processors. The processor(s) may execute computer program instructions and interact with other system components for performing the various functionalities described herein. The computer program instructions may be stored in a memory implemented using a standard memory device, such as, for example, a random access memory (RAM). The computer program instructions may also be stored in other non-transitory computer readable media such as, for example, a CD-ROM, flash drive, or the like. The methods may also be implemented using hardware circuits (e.g., transistors, capacitors, logic gates, field programmable gate arrays (FPGAs), etc.), or combinations of hardware circuits, software, and firmware, as would be apparent to one of ordinary skill in the art.

Referring to the method 200 of FIG. 2, in step 210, a transmission cross coefficient (TCC) matrix (or its equivalent matrix), representing the illumination source for supplying light that transmits through the mask and the pupil for focusing the transmitted light onto a target substrate, is constructed, from which kernels (basis functions or coherence map kernels) K are derived by, for example, singular value decomposition (SVD) or eigenvalue decomposition (eigendecomposition), as is known by someone of ordinary skill in the art.

Figure 6:
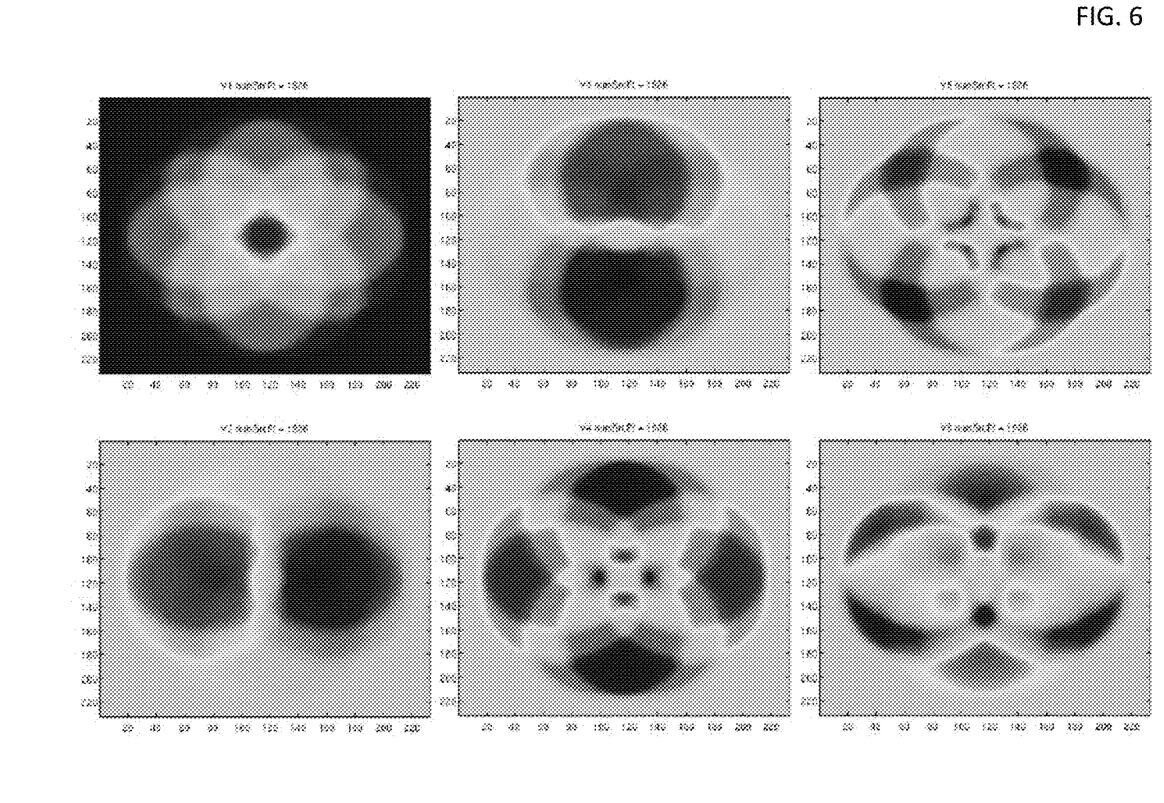
FIG. 6 illustrates example coherence map kernels according to an embodiment of the present invention.

In step 220, a cost function is defined as a sum of intensity contributions from those of the kernels considered to be most detrimental to imaging, such as one or more of the coherence map kernels having odd symmetry. The cost function G may be expressed as:

$$G = \int_{-\infty}^{\infty}\int_{-\infty}^{\infty} \sum_i |m(x, y) \otimes v_i(x, y)|^2 dxdy,$$

where $m(x,y)$ represents the mask, $\otimes$ represents the convolution operator, and each $v_i(x,y)$ represents an odd symmetry component of the coherence map kernels K. Put another way, the cost function may be defined as the area integral of intensity contribution from odd symmetry kernels, or the integral of the odd components of intensity. Here, the number of such odd symmetry components may be a set or predetermined value n, such as the n most significant odd symmetry components (as may be determined, for example, by corresponding eigenvalues in an eigendecomposition of the TCC matrix). See FIG. 6 for illustrations of example odd symmetry components of the coherence map kernels according to an embodiment of the present invention.

Figure 7:
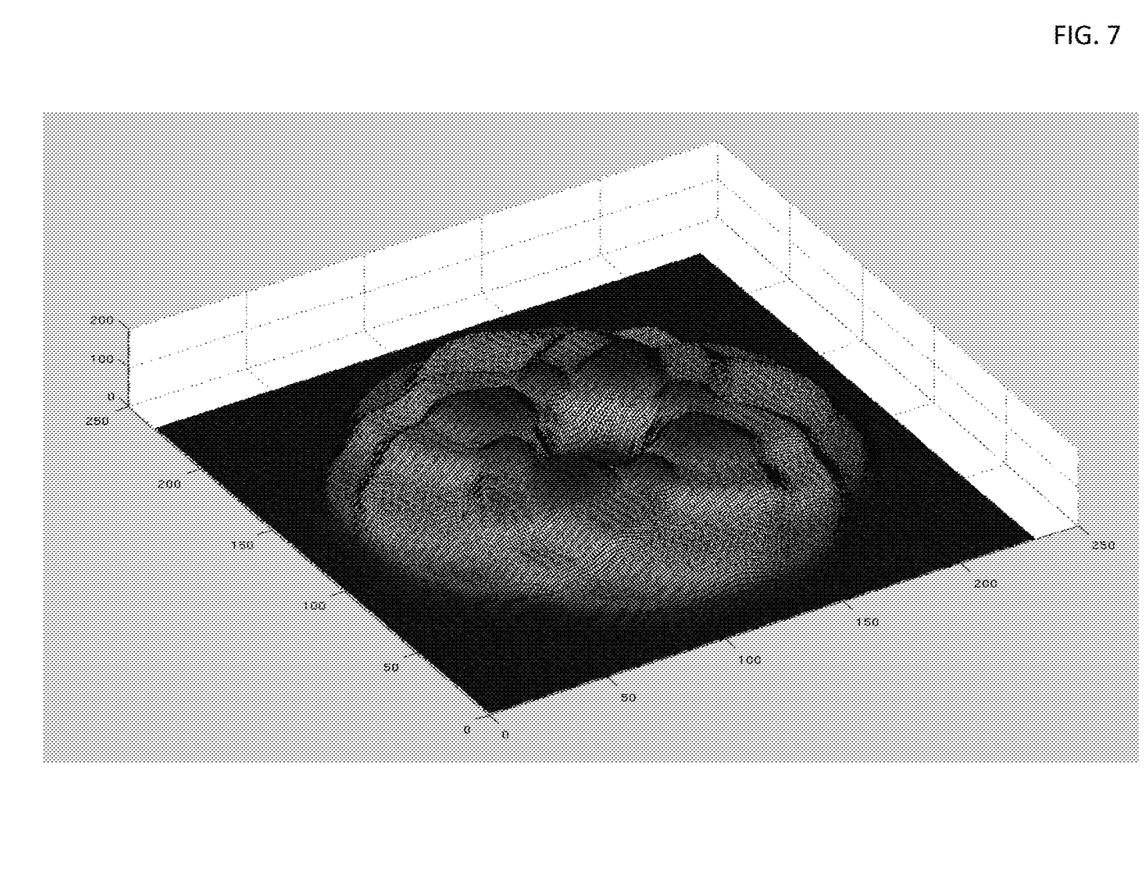
FIG. 7 illustrates an example field map according to an embodiment of the present invention.

In step 230, a functional derivative of the cost function G may be taken with respect to the mask function m to arrive at a closed form of the predicted mask field map (e.g., main features plus SRAFs). Stated another way, G may be minimized by the partial derivative $$\frac{\partial G}{\partial m} = 2m(x, y) \otimes w(x, y),$$

where $w(x,y) = \Sigma_i v_i(x,y) \otimes v_i(x,y)$ is a new (transformed) kernel (field map kernel) for generating the SRAF map. The resulting field map kernel $w(x,y)$ is the self-convolution of odd symmetry kernels summed. See FIG. 7 for an example field map kernel according to an embodiment of the present invention.

Figure 8:
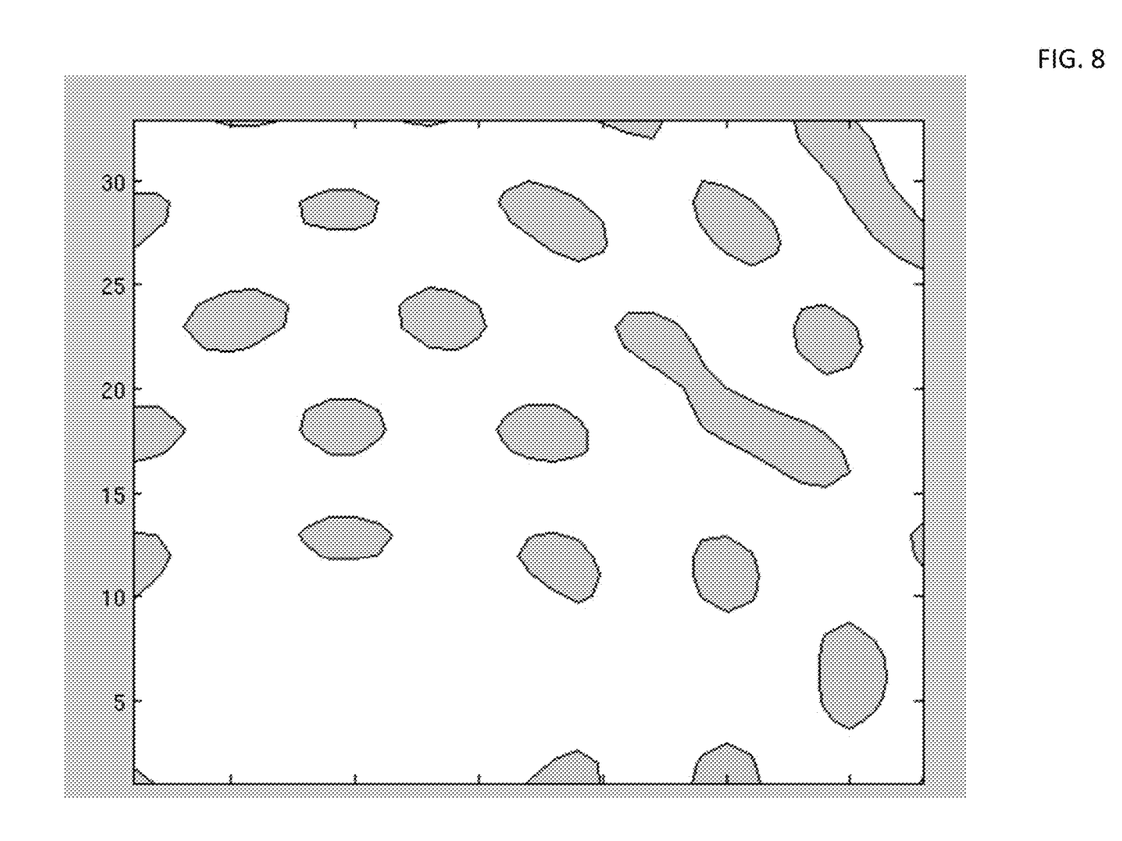
FIG. 8 illustrates example SRAFs extracted from a field map according to an embodiment of the present invention.

In step 240, thresholding the field map at 0 or a given value (e.g., identifying those portions of the mask having positive field map values or field map values exceeding a set or predetermined positive value) may produce regions where SRAFs are beneficial to producing desired features while reducing or eliminating the undesired intensity contributions. For example, the mask corresponding to the main features may be convolved with the field map kernel to produce a field map where the corresponding values are positive to identify the locations of the SRAFs. Put another way, the SRAF map may be determined based on the formula $$m(x,y) \otimes w(x,y) > 0$$

or $$m(x,y) \otimes w(x,y) > T$$

for some positive threshold T. See FIG. 8 for an example set of SRAFs extracted from a field map according to an embodiment of the present invention.

In some embodiments, the SRAF map may specifically exclude those portions of the mask identified as main feature areas. In other embodiments, the SRAF map may specifically include those portions of the mask identified as main feature areas. Here, the main feature areas may or may not include corresponding OPCs depending on the embodiment.

One consequence of this technique is that the field map kernel $w(x,y)$ need only be calculated once, which reduces or minimizes the number of Fourier transform (FFT) operations needed to solve for the resulting SRAF map compared to comparable techniques.

In step 250, reasonable mask rule check (MRC, also known as manufacturing rule check or similar names) is applied to the resulting SRAF map to ensure appropriate mask manufacturing rules are adhered to. These may include minimum widths and spaces between features or other such manufacturing rules that allow SRAF placement at only regions that make sense, as would be apparent to one of ordinary skill in the art. MRC is analogous to design rule check (DRC), which is applied to an intended design prior to resolution enhancement technologies (RET) such as SRAFs and OPC done by a mask manufacturer when doing sub-resolution photolithography.

In step 260, SRAF printability is checked with traditional intensity to adjust the size of the SRAFs if appropriate. Here, the SRAF printability check may ensure that the total intensity (e.g., from the SRAF and nearby features, including other SRAFs) does not cause any of the SRAFs to actually print. The corresponding size of any such SRAF or nearby SRAF may be reduced to prevent or substantially prevent such printing of the silicon wafer. This step may be combined with step 250 in this or possibly future iterations of the method 200. For example, in some embodiments, a simple SRAF size check may suffice as part of the MRC of step 250, depending on the process technology, as would be apparent to one of ordinary skill in the art.

In step 270, each of the SRAFs may be Manhattanized or otherwise adjusted to acceptable mask shapes that are manufacturable. For example, Manhattanizing the general shape of the SRAF field map may provide the final SRAF map that is optimal for the given layout under the available mask designs that may be fabricated. By way of example, mask designs may be governed by small square-shaped pixels, with features being a contiguous grouping of such pixels, such as a rectangle. By way of another example, the mask designs may further be permitted to layout rectangles according to a second pixel grid rotated 45° from the first grid. See, for example, FIG. 5 and further description below for example implementations of this step.

In step 280, the SRAFs and main features are combined as an updated mask. This may provide an acceptable mask layout to render the desired pattern, but if further accuracy is desired, steps 240-280 may be repeated (for example, one or two more times) using the main features and the SRAFs generated so far to create further field maps to obtain further (and more accurate) sets of SRAFs. For most situations, three such iterations are sufficient. However, the present invention is not limited thereto.

Figure 3:
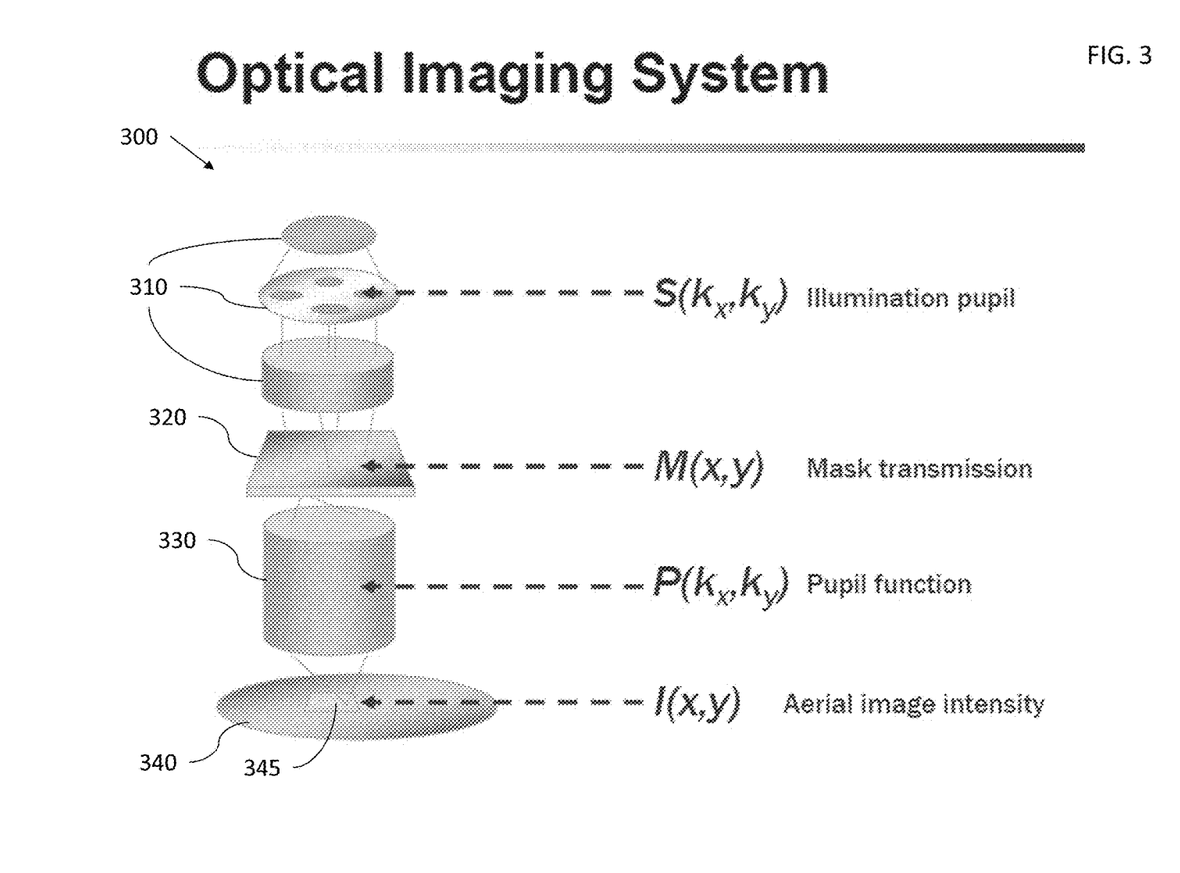
FIG. 3 is a schematic diagram of an optical imaging system and corresponding modeling functions for fabricating integrated circuit (IC) chips on a silicon substrate using photolithography according to an embodiment of the present invention.

FIG. 3 is a schematic diagram of an optical imaging system 300 and corresponding modeling functions for fabricating integrated circuit (IC) chips on a silicon substrate using photolithography according to an embodiment of the present invention.

The optical imaging system 300 of FIG. 3 may include: an illumination source 310 (e.g., lamp, lens, etc.) for providing light (e.g., ultraviolet (UV) light); a photomask 320 for patterning the light to a desired logic layer in an integrated circuit (IC) chip; a pupil 330 (e.g., lens) for directing (e.g., focusing, reducing, etc.) the transmitted and patterned light; and a silicon wafer 340 for receiving the patterned, focused, redirected light, such as on a target IC chip 345. More specifically, the light may be directed at photoresist on the wafer 340, causing it to chemically transform ("print") in a pattern coinciding with the desired logic layer.

The optical imaging system 300 may be modeled by a set of corresponding two-variable mathematical functions (representing a two dimensional cross-section at different stages of light transmission from the source 310 to the wafer 340. These functions include the source illumination $S(k_x,k_y)$, the photomask transmission $M(x,y)$, the pupil $P(k_x,k_y)$, and the final aerial image intensity $I(x,y)$ reaching the IC chip. The intensity $I(x,y)$ may control the exposure regions (and thus the final logic pattern) formed on the IC chip. One goal may be to render as faithful a reproduction of the intended layer design as possible, making sure intended features are reproduced and unintended features are not formed.

The intensity function may be defined in terms of the other functions as $$I(x \mid S(k)) = \sum_k S(k) \left| \sum_{k'} M(k'-k) P(k') \exp(ik' \cdot x) \right|^2$$

and $$I(x) = \sum_i \lambda_i \left| \sum_{k'} M(k') V_i(k') \exp(ik' \cdot x) \right|^2$$
$$= \sum_i \lambda_i |IFT[M \cdot V]|^2$$

where $\lambda_i$ is the i-th eigenvalue in the eigendecomposition of the transmission cross coefficient (TCC) matrix representing the source S and pupil P and having corresponding kernel $V_i$ for each i, and IFT represents the inverse Fourier transform.

Figure 4:
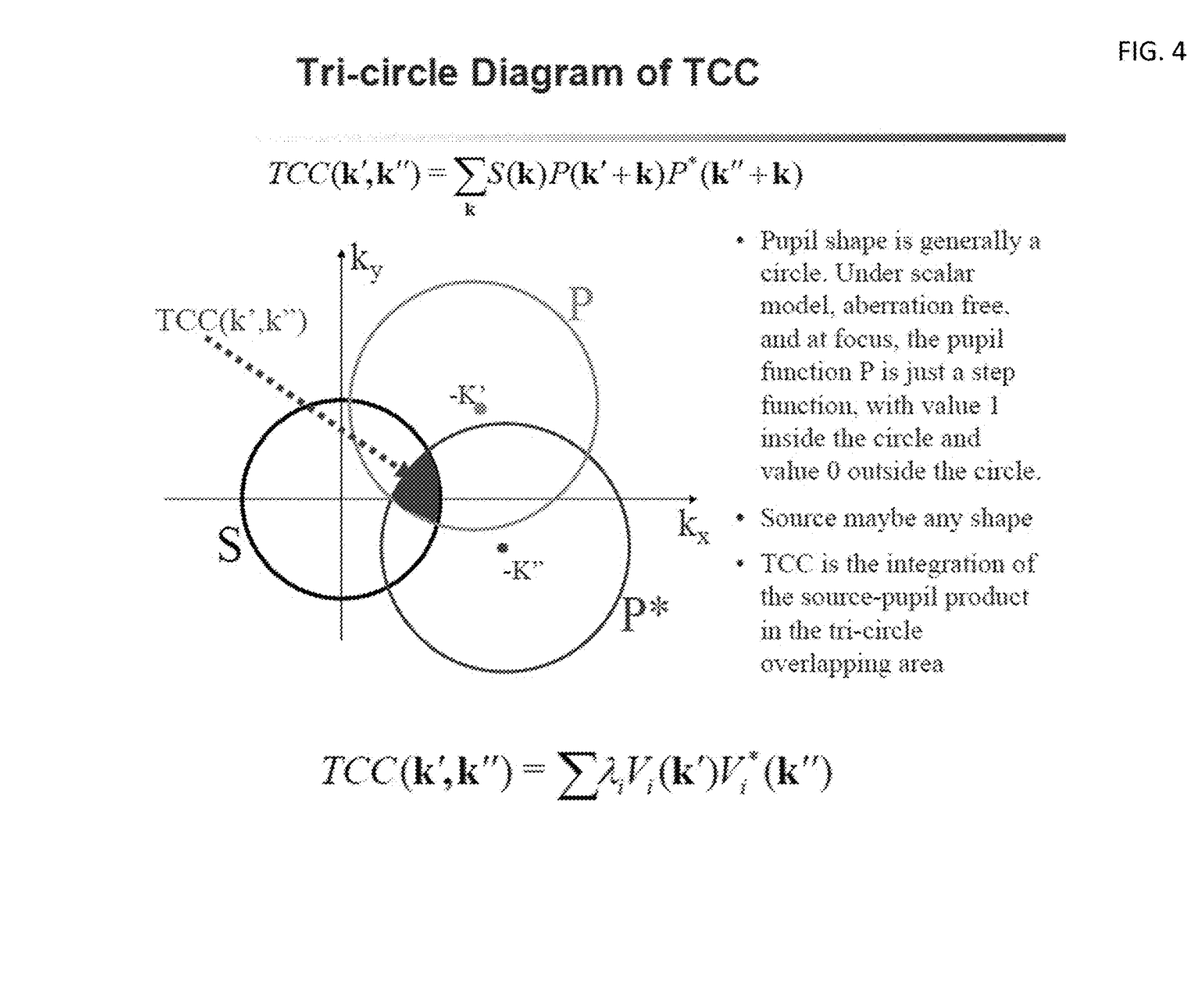
FIG. 4 is a schematic diagram illustrating an operation of the transmission cross coefficient (TCC) matrix representation of a fixed illumination source and moving pupil for modeling the aerial image of an optical imaging system for fabricating IC chips according to an embodiment of the present invention.

FIG. 4 is a schematic diagram illustrating an operation of the transmission cross coefficient (TCC) matrix representation of a fixed illumination source S and moving pupil P for modeling the aerial image of an optical imaging system for fabricating IC chips according to an embodiment of the present invention.

In FIG. 4, S, P, $\lambda_i$, and $V_i$ are as defined above, while the * operator represents the conjugate (e.g., P* represents the conjugate of P). The convolution corresponding to the TCC matrix may then be expressed as the area of the intersection of the three circles representing the (fixed) source S and the (moving) pupil and its conjugate P and P*.

Figure 5:
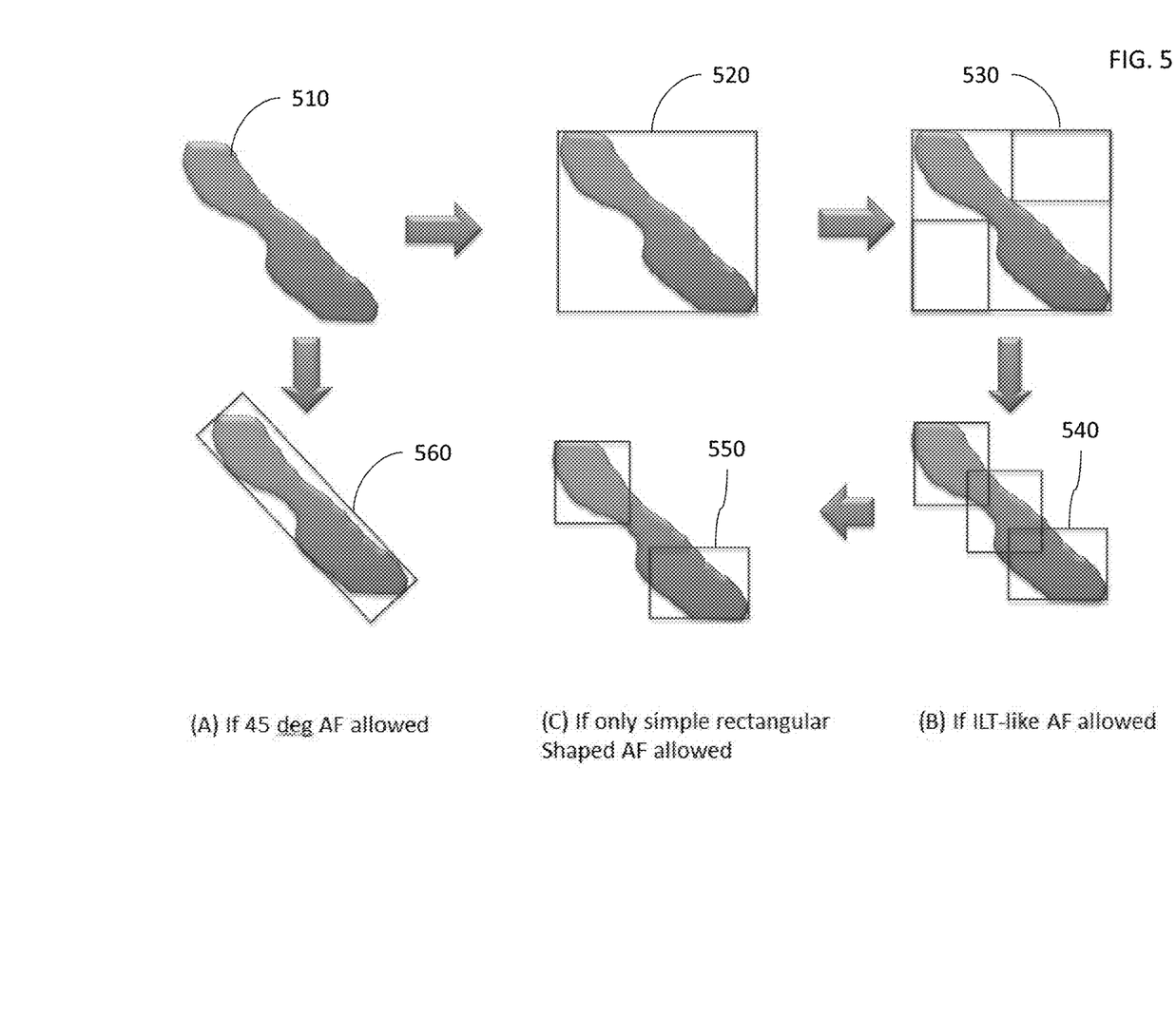
FIG. 5 illustrates example SRAF polygon extractions according to embodiments of the present invention.

FIG. 5 illustrates example SRAF polygon extractions according to embodiments of the present invention. SRAFs may be designed abstractly as virtually any contiguous shape, but usually must be implemented to conform to certain mask rules (e.g., sets of contiguous pixels or squares that make up a mask grid). Accordingly, polygon extraction is the conversion of an SRAF from an abstract or ideal shape to one (such as a rectangle oriented north-south or east-west) allowed by the mask manufacturer.

In FIG. 5 upper left, a potential SRAF 510 has been identified as a contiguous region. In FIG. 5 upper center, under a normal orientation rectangle methodology, the SRAF is contained in a smallest such rectangle 520 that holds the SRAF. This rectangle 520, however, contains too much non-SRAF space, so in FIG. 5 upper right, largest empty sub-rectangles 530 are identified and removed from the rectangle 520. The resulting shape, however, is not rectangular, so in FIG. 5 lower right (identified by B), the remaining portion is broken up into three partially overlapping sub-rectangles 540 that cover (or mostly cover) the SRAF, where each of these sub-rectangles 540 contain sufficient SRAF (such as over 60%, 70%, or some other set or predetermined amount) to render the original SRAF to an acceptable approximation. The overlapping SRAF sub-rectangles 540 are analogous to the OPC 134 of FIG. 1 overlapping the main feature 132.

However, when SRAF mask rules are constrained to proper non-overlapping rectangles, as in FIG. 5 lower center, only those non-overlapping sub-rectangles 550 may be included in the final SRAF mask. As an alternative to the above mask rules, rectangles with 45° inclinations to vertical or horizontal orientations may also be allowed, as in FIG. 5 lower left, where rectangle 560 is offset 45° with respect to vertical, but is nearly a perfect fit to contain the long slanted shape of the SRAF.

Some embodiments may provide for the use of very large scale integration (VLSI) lithography that may use projection systems. Such projection systems may use projection masks (or reticles) that ordinarily show (or expose) only one die or an array of dies ("field") at a time. Accordingly, these projection exposure systems (such as steppers) may project the projection masks onto the wafer multiple times (e.g., a different time for each area of the wafer, for as many times as needed to cover all of the dies on the wafer) to create the completed target pattern.

FIG. 6 illustrates example coherence map kernels according to an embodiment of the present invention.

FIG. 7 illustrates an example field map according to an embodiment of the present invention.

FIG. 8 illustrates example SRAFs extracted from a field map according to an embodiment of the present invention.

In summary, embodiments of the present invention provide for algorithms for determining SRAF placement in a photomask for sub-resolution photolithography. These algorithms have a sound physical basis and corresponding cost functions that reduce or minimize the L1 norm of certain transformed/modified intensity calculations (such as using one or more odd symmetry kernels). These algorithms may be applied without iteration, or in some embodiments, with only minimal iterations, such as one, two, or three. Accordingly, these algorithms may achieve desired goals of both accuracy and speed in the same implementation. However, the present invention is not limited to any particular embodiment or embodiments described herein.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof.

What is claimed is:

1. A method of making a photomask, the method comprising:
    constructing a transmission cross coefficient (TCC) matrix representing an illumination source for supplying light to transmit through the photomask and a pupil for focusing the transmitted light onto a target substrate to produce a set of main features;
    generating kernels through decomposition of the TCC matrix;
    selecting ones of the kernels having odd symmetry;
    generating a field map kernel as a sum of self-convolutions of the odd symmetry kernels;
    generating a first field map by convolving an area of the photomask corresponding to the set of main features with the field map kernel; and
    making the photomask corresponding to the first field map.

2. The method of claim 1, further comprising assigning first sub-resolution assist features (SRAFs) to those portions of the photomask area having corresponding first field map values exceeding a nonnegative threshold, wherein the making of the photomask comprises making the photomask corresponding to the set of main features and the first SRAFs.

3. The method of claim 2, further comprising performing SRAF rule processing on the first SRAFs to produce second SRAFs, wherein the making of the photomask comprises making the photomask corresponding to the set of main features and the second SRAFs.

4. The method of claim 3, wherein the SRAF rule processing comprises applying one or more of mask rule check (MRC), SRAF printability check, and polygon extraction to the first SRAFs to produce the second SRAFs.

5. The method of claim 3, further comprising generating a second field map by convolving an area of the photomask corresponding to the set of main features and the second SRAFs with the field map kernel, wherein the making of the photomask comprises making the photomask corresponding to the second field map.

6. The method of claim 5, further comprising:
    assigning third SRAFs to those portions of the photomask area having corresponding second field map values exceeding the nonnegative threshold; and
    performing the SRAF rule processing on the third SRAFs to produce fourth SRAFs,
    wherein the making of the photomask comprises making the photomask corresponding to the set of main features and the fourth SRAFs.

7. The method of claim 6, further comprising:
    generating a third field map by convolving an area of the photomask corresponding to the set of main features and the fourth SRAFs with the field map kernel;
    assigning fifth SRAFs to those portions of the photomask area having corresponding third field map values exceeding the nonnegative threshold; and
    performing the SRAF rule processing on the fifth SRAFs to produce sixth SRAFs,
    wherein the making of the photomask comprises making the photomask corresponding to the set of main features and the sixth SRAFs, and
    wherein the making of the photomask comprises making a projection photomask for use in very large scale integration (VLSI) lithography.

8. A system for making a photomask, the system comprising:
    a processor;
    a non-transitory physical medium, wherein the medium has instructions stored thereon that, when executed by the processor, causes the processor to:
        construct a transmission cross coefficient (TCC) matrix representing an illumination source for supplying light to transmit through the photomask and a pupil for focusing the transmitted light onto a target substrate to produce a set of main features;
        generate kernels through decomposition of the TCC matrix;
        select ones of the kernels having odd symmetry;
        generate a field map kernel as a sum of self-convolutions of the odd symmetry kernels; and
        generate a first field map by convolving an area of the photomask corresponding to the set of main features with the field map kernel; and
    a photomask fabricator configured to make the photomask corresponding to the first field map.

9. The system of claim 8,
    wherein the instructions, when executed by the processor, further cause the processor to assign first sub-resolution assist features (SRAFs) to those portions of the photomask area having corresponding first field map values exceeding a nonnegative threshold, and
    wherein the photomask fabricator is further configured to make the photomask corresponding to the set of main features and the first SRAFs.

10. The system of claim 9,
    wherein the instructions, when executed by the processor, further cause the processor to perform SRAF rule processing on the first SRAFs to produce second SRAFs, and
    wherein the photomask fabricator is further configured to make the photomask corresponding to the set of main features and the second SRAFs.

11. The system of claim 10, wherein the SRAF rule processing comprises applying one or more of mask rule check (MRC), SRAF printability check, and polygon extraction to the first SRAFs to produce the second SRAFs.

12. The system of claim 10,
    wherein the instructions, when executed by the processor, further cause the processor to generate a second field map by convolving an area of the photomask corresponding to the set of main features and the second SRAFs with the field map kernel, and
    wherein the photomask fabricator is further configured to make the photomask corresponding to the second field map.

13. The system of claim 12,
wherein the instructions, when executed by the processor, further cause the processor to:
assign third SRAFs to those portions of the photomask area having corresponding second field map values exceeding the nonnegative threshold; and
perform the SRAF rule processing on the third SRAFs to produce fourth SRAFs, and
wherein the photomask fabricator is further configured to make the photomask corresponding to the set of main features and the fourth SRAFs.

14. The system of claim 13,
wherein the instructions, when executed by the processor, further cause the processor to:
generate a third field map by convolving an area of the photomask corresponding to the set of main features and the fourth SRAFs with the field map kernel;
assign fifth SRAFs to those portions of the photomask area having corresponding third field map values exceeding the nonnegative threshold; and
perform the SRAF rule processing on the fifth SRAFs to produce sixth SRAFs,
wherein the photomask fabricator is further configured to make the photomask corresponding to the set of main features and the sixth SRAFs.

15. A method of making an integrated circuit (IC) chip on a silicon wafer, the method comprising:
making one or more photomasks, the making of each of the one or more photomasks comprising:
constructing a transmission cross coefficient (TCC) matrix representing an illumination source for supplying light to transmit through the photomask and a pupil for focusing the transmitted light onto a target substrate to produce a set of main features;
generating kernels through decomposition of the TCC matrix;
selecting ones of the kernels having odd symmetry;
generating a field map kernel as a sum of self-convolutions of the odd symmetry kernels;
generating a first field map by convolving an area of the photomask corresponding to the set of main features with the field map kernel; and
making the photomask corresponding to the first field map; and
using the one or more photomasks to fabricate the IC chip on the silicon wafer using photolithography.

16. The method of claim 15,
wherein the making of each of the one or more photomasks further comprises assigning first sub-resolution assist features (SRAFs) to those portions of the photomask area having corresponding first field map values exceeding a nonnegative threshold, and
wherein the making of the photomask comprises making the photomask corresponding to the set of main features and the first SRAFs.

17. The method of claim 16,
wherein the making of each of the one or more photomasks further comprises performing SRAF rule processing on the first SRAFs to produce second SRAFs, and
wherein the making of the photomask comprises making the photomask corresponding to the set of main features and the second SRAFs.

18. The method of claim 17, wherein the SRAF rule processing comprises applying one or more of mask rule check (MRC), SRAF printability check, and polygon extraction to the first SRAFs to produce the second SRAFs.

19. The method of claim 17,
wherein the making of each of the one or more photomasks further comprises:
generating a second field map by convolving an area of the photomask corresponding to the set of main features and the second SRAFs with the field map kernel;
assigning third SRAFs to those portions of the photomask area having corresponding second field map values exceeding the nonnegative threshold; and
performing the SRAF rule processing on the third SRAFs to produce fourth SRAFs, and
wherein the making of the photomask comprises making the photomask corresponding to the set of main features and the fourth SRAFs.

20. The method of claim 19,
wherein the making of each of the one or more photomasks further comprises:
generating a third field map by convolving an area of the photomask corresponding to the set of main features and the fourth SRAFs with the field map kernel;
assigning fifth SRAFs to those portions of the photomask area having corresponding third field map values exceeding the nonnegative threshold; and
performing the SRAF rule processing on the fifth SRAFs to produce sixth SRAFs,
wherein the making of the photomask comprises making the photomask corresponding to the set of main features and the sixth SRAFs.

* * * * *